(12) United States Patent
Mondello et al.

(10) Patent No.: US 11,443,821 B2
(45) Date of Patent: Sep. 13, 2022

(54) MEMORY DEVICE ARCHITECTURE COUPLED TO A SYSTEM-ON-CHIP

(71) Applicant: Micron Technology, Inc., Boise, ID (US)

(72) Inventors: Antonino Mondello, Messina (IT); Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 16/625,318

(22) PCT Filed: May 31, 2019

(86) PCT No.: PCT/IB2019/000465
§ 371 (c)(1),
(2) Date: Dec. 20, 2019

(87) PCT Pub. No.: WO2020/240227
PCT Pub. Date: Dec. 3, 2020

(65) Prior Publication Data
US 2021/0335439 A1    Oct. 28, 2021

(51) Int. Cl.
| | |
|---|---|
| *G11C 29/32* | (2006.01) |
| *G01R 31/28* | (2006.01) |
| *G11C 7/06* | (2006.01) |
| *G11C 29/16* | (2006.01) |
| *G11C 29/42* | (2006.01) |

(52) U.S. Cl.
CPC .......... *G11C 29/32* (2013.01); *G01R 31/2815* (2013.01); *G11C 7/06* (2013.01); *G11C 29/16* (2013.01); *G11C 29/42* (2013.01); *G11C 2029/3202* (2013.01)

(58) Field of Classification Search
None
See application file for complete search history.

(56) References Cited

U.S. PATENT DOCUMENTS

| | | |
|---|---|---|
| 5,394,403 A | 2/1995 | Klein |
| 6,925,583 B1 | 8/2005 | Khu et al. |
| (Continued) | | |

FOREIGN PATENT DOCUMENTS

CN    1779643 A    5/2006

OTHER PUBLICATIONS

International Search Report and Written Opinion from related International Application No. PCT/IB2019/000465, dated Jun. 23, 2020, 20 pages.

*Primary Examiner* — Guerrier Merant
(74) *Attorney, Agent, or Firm* — Brooks, Cameron & Huebsch, PLLC

(57) ABSTRACT

The present disclosure relates to an apparatus comprising a non-volatile memory architecture configured to be coupled to a System-on-Chip (SoC) device. The non-volatile memory device coupled to the SoC having a structurally independent structure linked to the SoC includes a plurality of sub arrays forming a matrix of memory cells with associated decoding and sensing circuitry, sense amplifiers coupled to a corresponding sub array, a data buffer comprising a plurality of JTAG cells coupled to outputs of the sense amplifiers; and a scan-chain connecting together the JTAG cells of the data buffer.

20 Claims, 9 Drawing Sheets

(56) References Cited

U.S. PATENT DOCUMENTS

| | | | |
|---|---|---|---|
| 2002/0154536 A1* | 10/2002 | Perner | G11C 11/16 |
| | | | 365/158 |
| 2004/0128596 A1 | 7/2004 | Menon et al. | |
| 2005/0093568 A1* | 5/2005 | Ohara | G01R 31/318583 |
| | | | 326/30 |
| 2006/0149958 A1* | 7/2006 | Omathuna | G06F 9/445 |
| | | | 713/2 |
| 2007/0250744 A1 | 10/2007 | Nguyen et al. | |
| 2010/0332177 A1 | 12/2010 | Wu et al. | |
| 2011/0012643 A1* | 1/2011 | Jain | G11C 29/02 |
| | | | 327/52 |
| 2011/0090751 A1* | 4/2011 | Manna | G11C 29/4401 |
| | | | 365/200 |
| 2012/0272112 A1* | 10/2012 | Oh | H01L 23/481 |
| | | | 714/727 |
| 2014/0022836 A1* | 1/2014 | Kim | G11C 11/1675 |
| | | | 365/158 |
| 2014/0164725 A1 | 6/2014 | Jang et al. | |
| 2015/0269991 A1* | 9/2015 | Hsieh | G11C 29/32 |
| | | | 365/154 |
| 2016/0027485 A1* | 1/2016 | Park | G06F 11/076 |
| | | | 365/191 |
| 2018/0012636 A1* | 1/2018 | Alzheimer | G11C 7/065 |
| 2021/0287757 A1* | 9/2021 | Troia | G11C 29/026 |
| 2021/0335438 A1* | 10/2021 | Troia | G11C 7/065 |

* cited by examiner

MEMORY DEVICE ARCHITECTURE COUPLED TO A SYSTEM-ON-CHIP

PRIORITY INFORMATION

This application is a National Stage Application under 35 U.S.C. § 371 of International Application Number PCT/IB2019/000465, filed on May 31, 2019, the contents of which are incorporated herein by reference.

The present invention relates to memory devices and more particularly to an architecture of flash memory device that is coupled to a System-on-Chip (SoC). More specifically, the invention relates to a scalable and high throughput architecture for a flash array of memory cells.

BACKGROUND

A flash memory is a type of non-volatile memory that retains stored data without a periodic refresh thanks to the electricity. An important feature of a flash memory is the very fast access time and the fact that it can be erased in blocks instead of one byte at a time. Each erasable block of memory comprises a plurality of non-volatile memory cells arranged in a matrix of rows and columns. Each cell is coupled to an access line and/or a data line. The cells are read, programmed and erased by manipulating the voltages on the access and data lines.

Non-volatile memories retain their contents when power is switched off, making them good choices for storing information that must be retrieved after a system power-cycle. However, a non-volatile memory is typically much slower to read and write to than a volatile memory, and often has more complex writing and erasing procedures; moreover, relatively high voltages must be applied to the array of cells. The read phase is often done using a Finite State Machine (FSM) that regulates all the timings and internal voltages.

Non-volatile Flash memories are today one of the fundamental building blocks in modern electronic systems, including the SoC devices for automotive applications, in particular for RealTime Operating Systems (RTOS). Their performance in terms of speed, consumption, alterability, nonvolatility and the increasing importance of system reconfigurability have pushed up to now for flash memory integration in System-on-Chip devices. However, embedded memories realized with the SoC technologies are becoming larger and larger components in a SoC and it is not effective to increase their size to more than 128 Mbit for instance.

Flash integration introduces many issues both at system and at circuit/technology levels that need a careful design. From the system point of view, several aspects are involved in the choice of the flash memory type to be integrated in the SoC device; the most important ones, depending on the specific applications and requirements, are the yield and then their cost, power consumption, reliability and performance requirements.

DETAILED DESCRIPTION

On-chip memory is the simplest type of memory for use in many kinds of controllers an FPGA-based embedded system. The memory is implemented in the FPGA itself; consequently, no external connections are necessary on the circuit board.

A field-programmable gate array (FPGA) is an integrated circuit designed to be configured by a customer or a designer after manufacturing.

FPGAs contain an array of programmable logic blocks, and a hierarchy of reconfigurable interconnects that allow the blocks to be wired together, like many logic gates that can be inter-wired in different configurations. Logic blocks can be configured to perform complex combinational functions, or merely simple logic gates like AND and XOR, for example.

In most FPGAs, logic blocks also include memory elements, which may be simple flip-flops or more complete blocks of memory. Many FPGAs can be reprogrammed to implement different logic functions, allowing flexible reconfigurable computing as performed in computer software.

Most modern embedded systems use some type of flash memory devices for non-volatile storage. Embedded systems use memories for a range of tasks, such as the storage of software code and lookup tables (LUTs) for hardware accelerators.

With reference to the figures, apparatuses and methods involving a non-volatile memory device or component and a host device for such a memory device will be disclosed herein.

Descriptions of well-known components and processing techniques are omitted so as to not unnecessarily obscure the embodiments herein. The examples used herein are intended merely to facilitate an understanding of ways in which the embodiments herein may be practised and to further enable those of skill in the art to practice the embodiments herein. Accordingly, the examples should not be construed as limiting the scope of the embodiments herein.

A flash memory is a type of non-volatile memory that retains stored data without a periodic refresh thanks to the electricity. Flash memories can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the access and data lines.

Currently, the technology of the complex semiconductor structures known as System-on-Chips provides the integration of at least an embedded non-volatile memory, for instance up to 128 Mbit.

Figure 1:
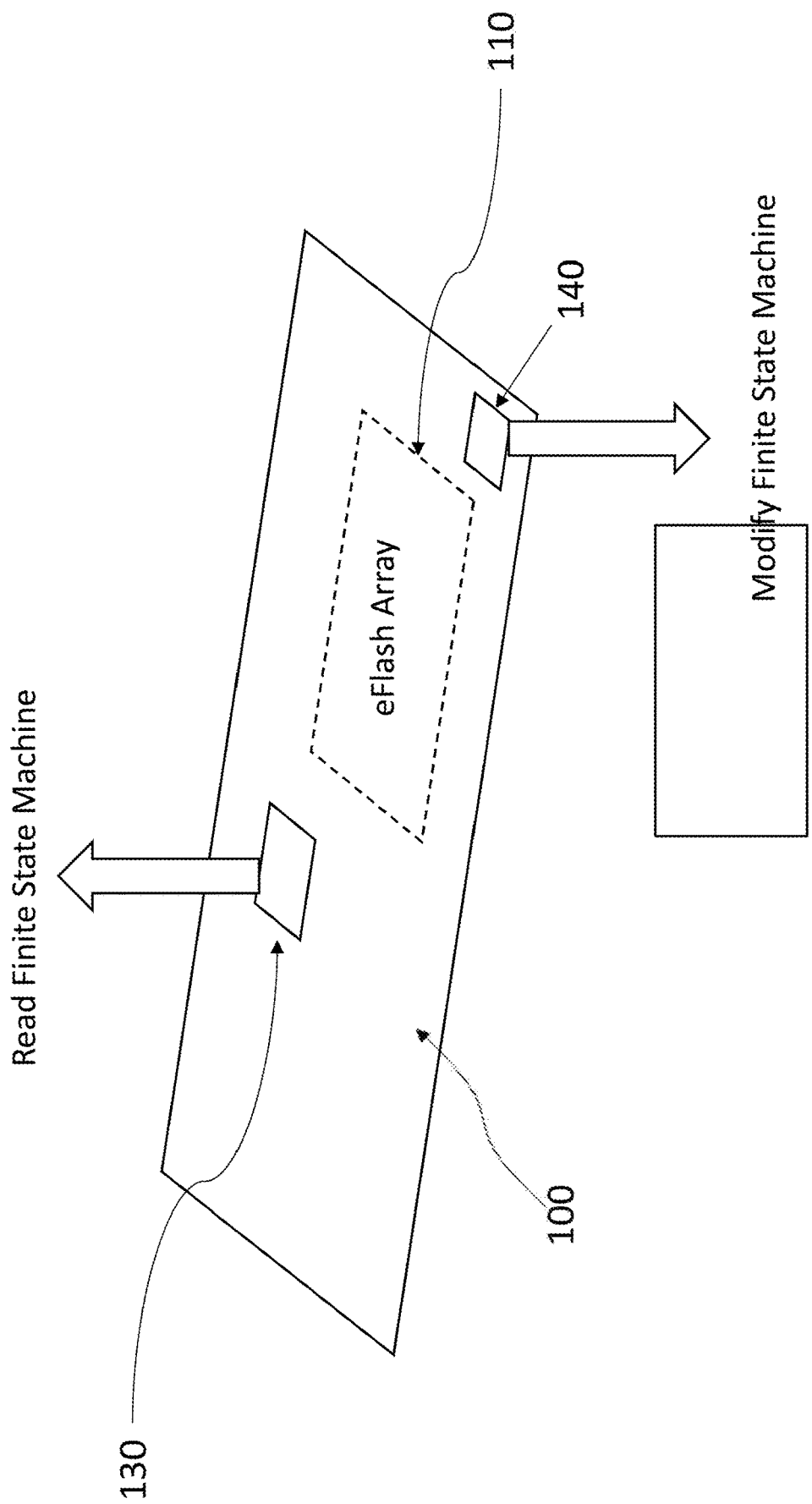
FIG. 1 is a schematic and perspective view of a System-on-Chip device according to the prior art and including an embedded memory portion.

FIG. 1 shows an example of a known solution of a complex System-on-Chip (SoC) structure 100 including a large circuit portion occupied by a conventional embedded non-volatile memory portion 110.

This embedded non-volatile memory portion 110 includes an array of Flash memory cells indicated in FIG. 1 as eFlash Array.

In order to read the memory cells of the array, it is provided a dedicated circuit portion 130 including an optimized Read Finite State Machine that is used to ensure high read performance, such as branch prediction, fetch/pre-fetch, interrupt management, error correction and so on.

In order to write and erase the memory cells of the Array, it is provided a dedicated logic circuit portion 140 including a simplified Reduced Instruction Set Computer (RISC) controller or a Modify Finite State Machine which is the logic circuit for handling the programming and erasing algorithms.

While being advantageous under many aspects, the System-on-Chips including large memory arrays may suffer for many drawbacks since the memory portion is realized with a process not specifically designed for memories and possible defects of the memory array may compromise the life or the functioning of the whole SoC structure. Moreover, if a SoC has already a flash array as an embedded memory it would be desirable to have also an extended non-volatile memory as a sort of far memory.

According to embodiments of the present disclosure, to improve the performances of the whole SoC structure the old memory portion 110 has been realized as an independent memory device with a technology specifically dedicated to the manufacturing of flash memory devices. This new memory component is associated and linked to the SoC structure partially overlapping such a structure while the corresponding semiconductor area of the SoC structure has been used for other logic circuits and for providing support for the overlapping structurally independent memory portion.

Therefore, an aim of the present disclosure is that of suggesting a non-volatile memory structure that can improve the access time. In any case, the System-on-Chip and the associated memory device are realized on a respective die obtained by a different lithography process.

Figure 2:
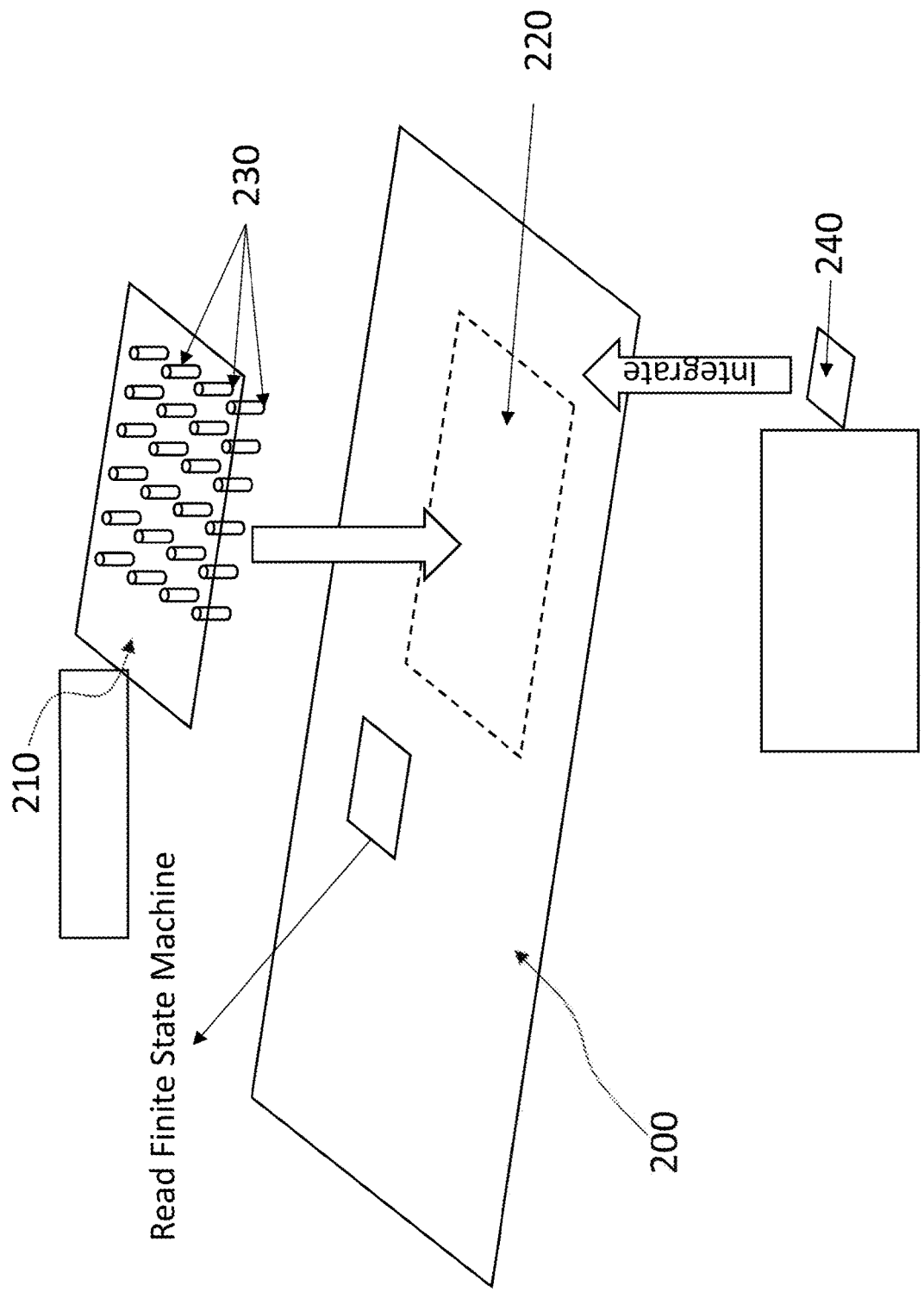
FIG. 2 is a schematic and perspective view of a System-on-Chip device according to the present disclosure and including a memory component replacing the embedded memory portion of the prior art devices.

As shown in FIG. 2, according to the present disclosure, we may consider that the memory portion (i.e. the old reference number 110 of FIG. 1) has been removed from the SoC structure thus allowing to use the corresponding semi-conductor area for other logic circuits and for providing support for a structurally independent memory component 210 partially overlapping a SoC structure 200.

The memory component 210 is structured as a stand-alone device realized in a single die with a technology specifically dedicated to the manufacturing of flash memory devices. The memory component 210 is an independent structure but it is strictly associated to the host device or to the SoC structure. More particularly, the memory component 210 is associated and linked to the SoC structure partially overlapping such a structure while the corresponding semiconductor area of the SoC structure has been used for other logic circuits and for providing support for the partially overlapping structurally independent memory device 210 for instance through a plurality of pillars 230 or other similar alternative connections such as ball on grid or with a technology similar to the Flip-Chip technology.

In one embodiment of the present disclosure the disposition of the pads of the memory component 210 has been realized on a surface of the memory component at the periphery of the structurally independent Flash device. More specifically, the plurality of pads has been realized around the array so that when the memory component 210 is reversed and its pads are faced to corresponding pads of the SoC structure 200. The semiconductor area that in known System-on-Chip devices that in known solution was occupied by an embedded non-volatile memory portion is now dedicated to the housing of the interconnecting pads corresponding to the pads of the memory component 210.

More particularly, adopting a Pads Over Logic technology, the pads are built on top of the logic used to communicate with the independent and overlapping memory component 210, similarly to the 3DN and implementing the circuit under the array (CUA technology).

In order to mount the chip to external circuitry (e.g., a circuit board or another chip or wafer), the chip is flipped over so that its top side faces down and aligned pads-to-pads so that its pads are aligned with matching pads on the external circuit. Then the solder is reflowed to complete the interconnections.

This technology is different from wire bonding, in which the chip is mounted upright and wires are used to interconnect the chip pads to external circuitry.

The final configuration will be a face-to-face interconnection SoC/Flash Array with the sense amplifiers will be connected to the SoC in a Direct Memory Access configuration.

At the end, the memory component 210 is manufactured according to the user's needs in a range of values that may vary according to the available technology, for instance from at least 128 Mbit to 512 Mbit or even more without any limitation for the applicant's rights. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

The result of this solution is the new SoC structure of FIG. 2, strictly associated with the new structurally independent memory component 210 that is coupled to the SoC structure 200, for instance through a plurality of coupling elements 230, such as pillars, as well as through ball-on-grid, flip-chip technology, face-to-face interconnection (coils) and the like. In one embodiment, the coupling elements are pillars 230, which are arranged in the semiconductor area 220 previously dedicated to the embedded memory portion 110 of FIG. 1.

In one embodiment of the present disclosure, the memory component 210 for the SoC structure 200 includes at least a memory portion and a logic circuit portion for interacting with the memory portion and with the SoC structure 200, wherein the memory component 210 is a structurally independent semiconductor device coupled to and partially overlapping the System-on-Chip structure 210. A logic circuit 240 is integrated in the SoC structure 200 to cooperate with the logic circuit portion of the memory component 210.

The coupling between the SoC structure 200 and the memory component 210 is made by interconnecting a plurality of respective pads or pin terminals that are faced one toward the other in a circuit layout that keeps the alignment of the pads even if the size of the memory component 210 is modified.

In one embodiment of the present disclosure, the arrangement of the pads of the memory component 210 has been realized on a surface of the memory component 210. More specifically, the pads are arranged over the array so that, when the memory component 210 is reversed, its pads are faced to corresponding pads of the SoC structure 200. The semiconductor area 220 that in known System-on-Chip structures 100 was occupied by the embedded non-volatile memory portion is dedicated to the housing of the interconnecting pads corresponding to the pads of the memory component 210.

Even a memory component of a larger size may be supported and interconnected with the pads of the SoC structure 200, keeping the position and dislocation of its interconnecting pads.

In the contest of the present disclosure, the SoC structure 200 has its top side linked with the reversed side of the memory component 210, the pads of the SoC structure 200 being aligned with matching pads of the reversed memory component.

As an alternative, the structurally independent memory component 210 may be coupled to the SoC structure 200 in a face-to-face manner. If a face-to-face coupling is adopted, a stack of memory components of the same size could be overlapped realizing a stack structure, wherein each independent component is addressed by the logic circuitry of the SoC structure 200 though a corresponding identification address.

The semiconductor area 220 previously occupied by the embedded memory portion 110 is now used to implement additional functionalities and to prepare the semiconductor device for a Logic Over Pads technology. The expression "Logic Over Pads" means providing logic circuitry overlapping some connection pads located internally to a first or base layer represented by a complete semiconductor product, i.e. the SoC structure 200.

The memory component 210 thus represents an upper layer coupled and interconnected to the base SoC structure 200. The memory component 210 partially overlaps the SoC structure surface covering at least the semiconductor area 220 previously occupied by the embedded memory portion 110. However, the memory component 210 has a greater capacity can cover a larger semiconductor area than the semiconductor area 220. In this respect, the size of the overlapping memory component 210 is larger than size of the overlapped semiconductor area 220 dedicated to the interconnections with such covering memory component 210. In other words, the area of the overlapping memory component 210 is larger than the semiconductor area 220 of the SoC structure 200 dedicated to the interconnecting pads for the memory component 210.

Moreover, for a better functioning of the SoC structure 200, even the logic circuit portion 140 of FIG. 1 (which in the System-on-Chip structure 100 of FIG. 1 included the Modify Finite State Machine or RISC) can be removed and reorganized in association with the memory component 210. For supporting the write and erase phases performed on the larger memory component 210, a Modify Finite State Machine or RISC 240 has migrated into the memory component 210.

As previously indicated, the memory component 210 includes the logic circuit portion for interacting with the memory portion and with the SoC structure 200.

The separation and optimization of the logic circuit portion further allows to enhance the functionality of the whole SoC structure 200, thus obtaining an independent semiconductor memory component 210 coupled to the SoC structure 200.

This independent semiconductor memory component 210 therefore includes at least the memory portion (preferably a non-volatile memory portion) and the associated modify finite state machine 240, both incorporated into a semiconductor product that is coupled to the SoC structure 200. In this case, the logic embedded in the SoC is the read logic: fetch of the data, correction of the data, elaboration and execution.

As will appear in the following of the present disclosure, a DMA capability is provided to the memory component 210 with an interface logic JTAG TAP using modified JTAG cells as well as a flexible TDI, secure access, address buffers and other features for handling the communication with the SoC structure 200.

In other words, both the non-volatile memory portion and the associated logic circuit portion are integrated in the independent semiconductor memory component 210 that is coupled and connected to the SoC structure 200.

Figure 3:
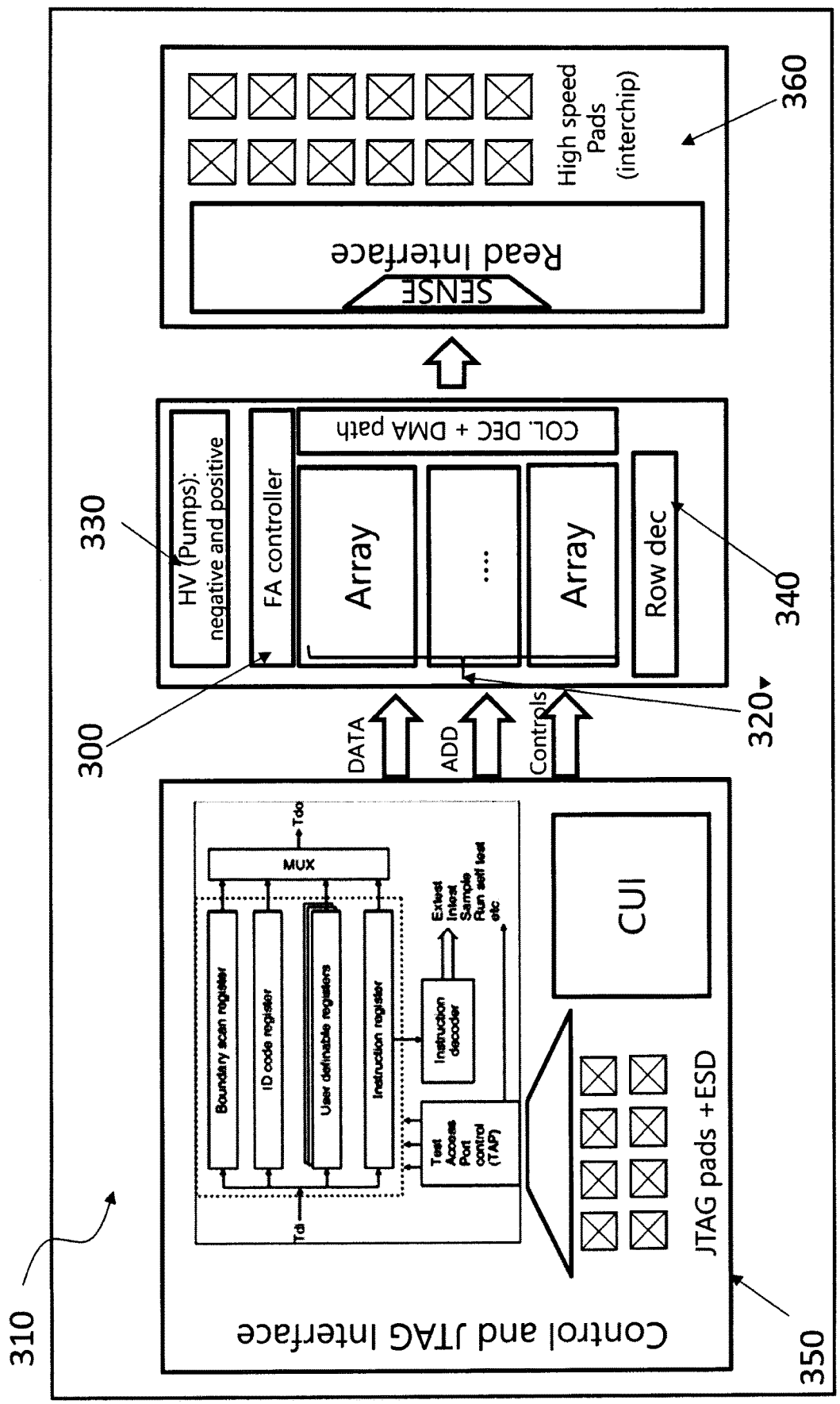
FIG. 3 is a schematic view of the memory component according to the present disclosure.

Now, with more specific reference to the example of FIG. 3, the main structure of the memory component 310 according to an embodiment of the present disclosure will be disclosed, wherein the reference 310 of FIG. 3 corresponds to the reference 210 of FIG. 2.

The memory component 310 includes at least: an I/O circuit, a micro-sequencer, an array of memory cells 320, an array peripheral, a charge pump architecture, address decoders, sense amplifiers and corresponding latches, a service logic to connect all the parts of the memory, and a command user interface, for instance a CUI block.

The array of memory cells 320 includes non-volatile Flash memory cells.

In ne embodiment of the present disclosure, the memory component 310 implements a Direct Memory Access type of memory to replace the embedded memory array of known SoC devices.

Moreover, a JTAG interface 350 is adopted for the test of the memory component 310, allowing the re-use of the testing tooling. Therefore, the memory component 310 also comprises a JTAG logic 350. This JTAG interface 350 will be disclosed later in more details with reference to FIG. 6.

Figure 6:
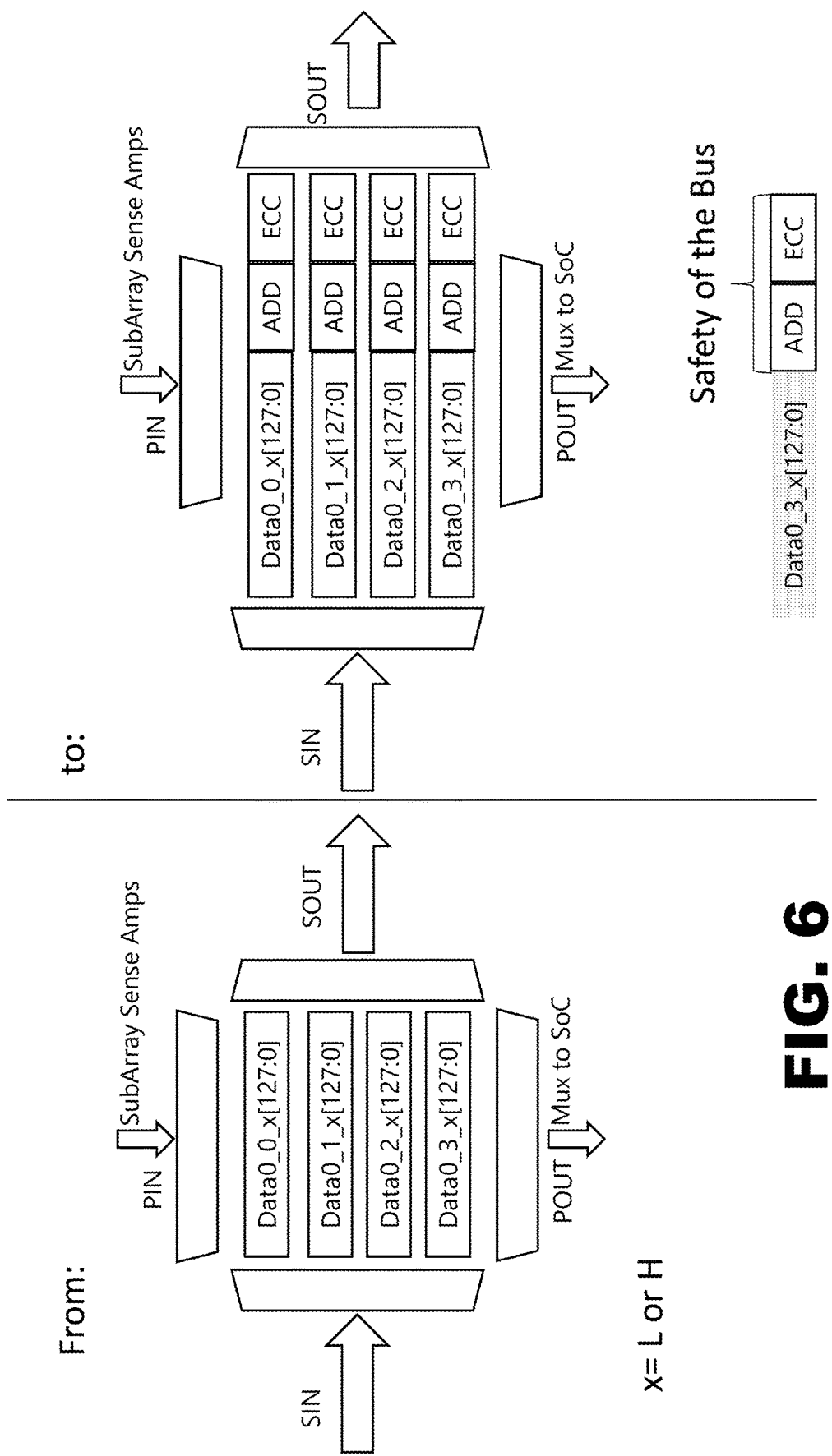
FIG. 6 is a schematic view of a group of address registers for a memory word in the memory portion of the present disclosure.

In more details, each memory array includes at least a JTAG interface 350 receiving as inputs standard JTAG signals: TMS, TCK, TDI as well as data from a memory page, as shown in FIG. 6. According to embodiments of the present disclosure, an extended TDI is used as flexible TDI. The flexibility is due to the fact that the number of parallel bits working as TDI are depending from the selected registers, i.e. K (four, in the example) lines for the instruction register, M lines for the address register, N lines for the data register, etc. while TDI comes from the JTAG protocol that uses TDI as name on the signal used to fill the registers.

This JTAG interface 350 produce as output data, addresses and control signals that are transferred to a memory address decoder 340 and also to the internal flash controller 4300 to perform modify, testing, verification operations.

The activity of the decoder 340 is allowed by charge pumps 3430 structured to keep secret the voltages and timings to manage the array. The decoding phase drives the data lines while the charge pumps provide the high voltage routed by the address decoder in the selected data lines.

This decoder 340 addresses the selected memory block. The address decoder is connected to the array to select the proper data lines, i.e. row and column for each super-page. the read, modify and any other operations are using the address decoder to properly address bytes in the memory array.

A memory block is connected to the sense amplifiers and the sense amplifiers of the read interface 360 are connected to the SoC structure 200 using the modified JTAG cells. The communication channel between the flash array blocks and the SoC structure 200 is represented by a control and status bus.

The output of the read interface 360 is represented by an extended page including the combined string of data cells+ address cells+ECC cells. The write operation also drives the three components (data cells+address cells+ECC cells) of the extended page; the ECC and the address cells serves as a safety mechanism to ensure the low probability to make mistakes.

The total amount of Bits would involve in the example disclosed herewith N+M+R Bits, for instance one-hundred-sixty-eight pads per channel in the implementation disclosed herewith.

The memory array 320 of the memory component 310 is built as a collection of subarrays. The scan chains can be connected to form a unique shift register to proper test the interconnections.

The advantage of this architecture is that it is very scalable, wherein expanding and/or reducing the density of the final device translates only in mirroring a sub-array and providing the corresponding interconnections in a very scalable manner. The memory can be expanded also increasing the memory size per sub array, without enlarging the number of channels for the SoC.

The Direct Memory Access allows to reduce the final latency that the SoC can experience when reading the data.

Figure 4:
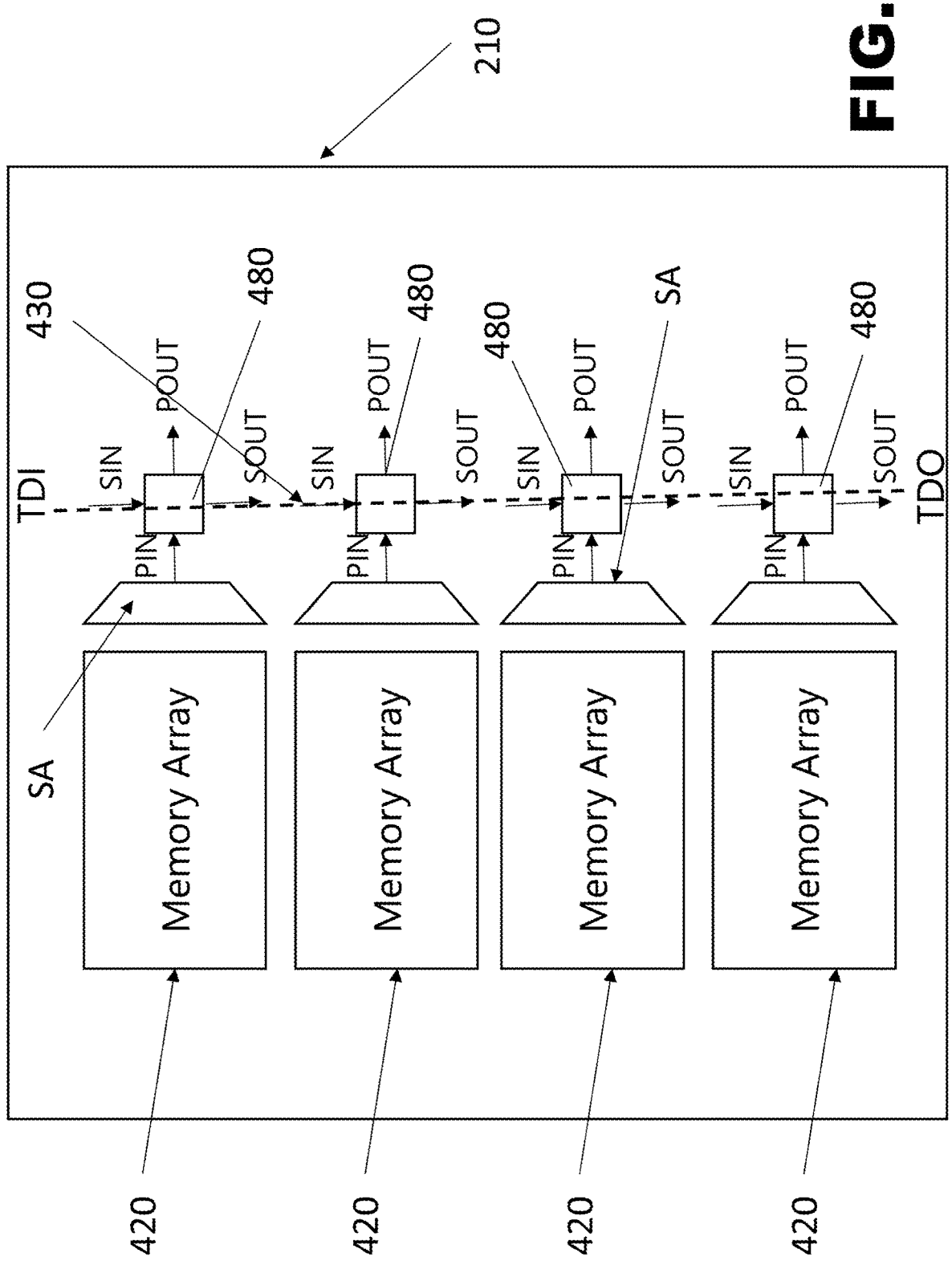
FIG. 4 is a schematic view of a particular of the memory portion shown in FIG. 3.

Coming now to a closer look to the internal structure of the memory component 210 (or 310) it should be noted that the architecture of the memory array 320 is built as a collection of sub arrays 420, as shown schematically in FIG. 4, wherein the reference 320 of FIG. 3 corresponds to the reference 420 of FIG. 4.

Figure 4A:
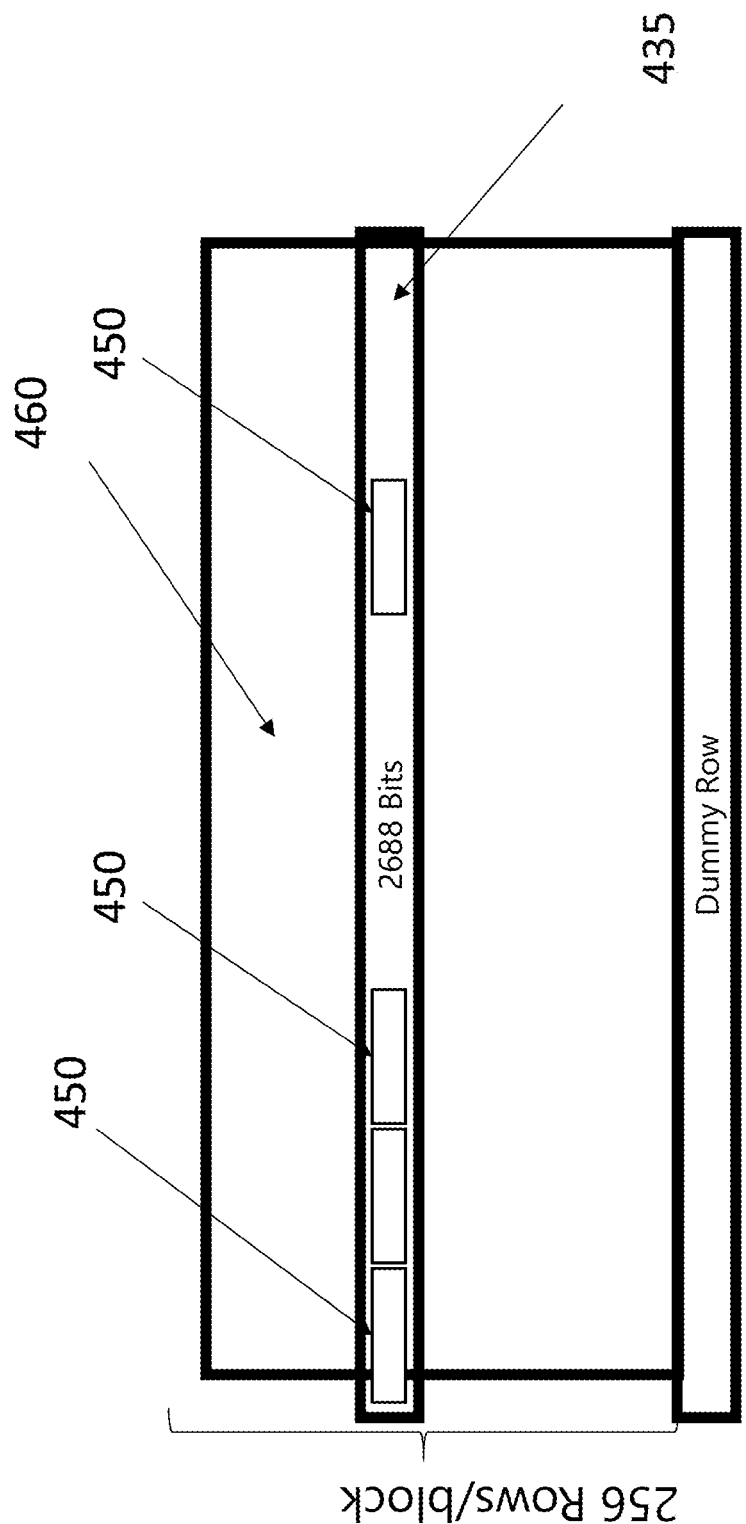
FIG. 4A is another schematic view of a further particular of the memory portion shown in FIG. 4.

Each sub array 420 is independently addressable inside the memory device 310. Each sub-array 420 contains multiple memory blocks 460 (as depicted in FIG. 4A).

In this manner, having smaller sectors if compared to known solutions the access time is significantly reduced and the whole throughput of the memory component is improved. The reduction of the initial latency time is at block level because the row and column lines, the read path associated latency and the external communication have been optimized. The initial latency is the time needed to have the first valid data after the issuing of the address.

In the embodiments disclosed herewith the memory array is structured with a number of sub-arrays 420 corresponding to the number of cores of the associated SoC structure 200 and, therefore to the number of corresponding communication channels. For instance, at least four memory sub arrays 420 one for each communication channel with a corresponding core of the SoC structure 200 are provided.

The host device or the System-on-Chip (SoC) structure 200 normally includes more than one core and each core is coupled to a corresponding bus or channel for receiving and transferring data to the memory component 210 or 310. We will make a generic reference to a number of K buses for N data Bits.

Therefore, in the present implementation each sub-array 420 has access to a corresponding channel to communicate with a corresponding core of the SoC structure 200. The outcome of the memory blocks is driven directly to the SoC without using high power output buffers and optimizing the path.

The advantage of this architecture is that it is very scalable, wherein expanding and/or reducing the density of the final device translates only in mirroring a sub-array and generating the connection or increasing the number of blocks of each subarray, that is the available density per core.

In embodiments of the present disclosure each independently addressable location of the blocks of each memory sub array 420 addresses an extended page 450 that will be also defined hereinafter with the term super-page intending a double extended page.

As non-limiting example, this extended page 450 comprises a string including a first group of at least N Bits, for instance one-hundred-twenty-eight (128) Bit for the I/O data exchange with the SoC structure 200 plus at least a second group of M Bits, for instance twenty-four (24) address Bit and a final or third group of at least R Bits, for instance sixteen (16) ECC Bit. The M address Bit (in the example the twenty-four address Bits) are sufficient to address up to 2 GigaBit of available memory space.

According to the present disclosure, the outputs of the sense amplifiers SA prepare a double extended page at a time, i.e. a super-page 450 comprising a number of Bits given by the double combination of the above-mentioned three groups of data bits, address bits and ECC bits, according to the size of the memory array.

In the specific but non-limiting example disclosed herewith each extended page 450 includes at least 168 Bit obtained by the combination of the above three groups of N+M+R=128+24+16 data, address and ECC Bit and each super-page is formed by a couple of extended pages, i.e. a group of 168×2 Bits.

Just to give a non-limiting numeric example, each row of a memory block 460 includes sixteen extended pages. Therefore, the resulting row includes 2688 Bit coming out from the combination of sixteen extended pages independently addressable and each including 168 Bit or, said differently, the combination of eight super-pages.

In embodiments of the present disclosure the output of a generic sub-array 420 is formed combining the following sequence: N data cells plus M address cells plus R ECC cells. In this non-limiting example the total amount of Bits would involve 168 pads per channel, as shown in the example FIG. 6.

The combined string of data cells+address cells+ECC cells allows implementing the safety coverage of the bus according to the standard requirements, because the ECC covers the whole bus communication (data cells+address cells), while the presence of the address cells provide the confidence that the data is coming exactly from the addressed location of the controller.

The sense amplifiers SA of each sub array 420 are connected with a scan-chain of modified JTAG cells 480, connecting together all the output of one sub-array 420, as disclosed hereinafter.

Thanks to the memory architecture of the present disclosure it is possible to pass from a parallel mode for retrieving data and addresses from the memory sub arrays 420 to a serial mode for checking the interconnections between the memory component 210 and the associated SoC structure 200. Moreover, the SoC structure 200 is entitled to read once '1' and once '0' to perform tests and can also analyze the memory outcome, scanning out the data using the scan-chain.

It should be further noted that each subarray 420 includes address registers connected to data buffer registers, similarly to an architecture used in a DRAM memory device, i.e. DDRX type of DRAMs.

In the following paragraphs of the present disclosure it will be apparent that the outputs of the sense amplifiers SA per sub array 420 are latched by an internal circuit, so to allow to the sense amplifiers to execute a further internal read operation to prepare the second nibble or group of 168 Bits. This second nibble is transferred to the output of the flash array 320, using an additional enabling signal (i.e. an internal clock signal or an ADV signal; ADV=Address Data Valid. in our case the signal is load_data[1:0], depending on the addressed flip flop) that transfers the content read at sense amplifier level to the host device or SoC structure 200.

In other words, the internal sense amplifiers prepare two extended pages 450 and while the first page is ready to be shifted (or also shifted out), internally it is performed a reading phase of the second page associated with the same address. This allows to prepare from five to eight double word (in the present example), that are typical in the RTOS application. In any case, the disclosed structure can be expanded to allow multi-page read while shifting out the already read page.

The sense amplifiers SA are connected directly to a modified JTAG cells 480, that will be later disclosed in greater details, so to integrate a JTAG structure and the sense amplifiers in a single circuit portion. This allows reducing as much as possible the delay in propagating the output of the memory array to the SoC.

Just to report a numeric example based on the embodiment disclosed herewith, we may remark that each address in the address buffers is linked to a data buffer, containing for instance N data Bits (i.e. 128 Bits). However, the SoC can need up to 2*N Bits (i.e. 256 Bits, without the address Bits and the ECC) at a time, so the data buffers will be duplicated so to be able to shift, assuming to use the address 0 of the sub array 0:
First pass of the first group of N Bits: Data 0_0_H [127:0]
Second pass of the second group of N Bits: Data 0_0_L [127:0]

The above indications are for a standard read used for instance for safety purpose and data integrity/correction.

In one embodiment the address buffers are realized making use of modified JTAG cells 480 as we will see hereinafter.

According to one embodiment of the present disclosure it is disclosed a Flash memory device architecture coupled to a System-on-Chip including a matrix of memory cells with associated decoding and sensing circuitry and having a structurally independent structure coupled and linked to the System-on-Chip and comprising:
  a plurality of sub arrays forming said matrix of memory cells;
  sense amplifiers coupled to a corresponding sub array;
  a data buffer including a plurality of JTAG cells coupled to the outputs of the sense amplifiers;
  a scan-chain connecting together the JTAG cells of said data buffer.

As previously said, the sense amplifiers SA of each sub array 420 are connected with a scan-chain 430 (shown with a dotted line in FIG. 4), connecting together all the output of one sub-array 420, as shown in FIG. 4. Moreover, the sub array scan-chains 430 can be connected to form a unique chain for quickly checking the integrity of the pads interconnections.

Making reference to FIG. 4 we may consider the scan-chain 430 as formed by the interconnections of each JTAG Cell 480:
PIN is coupled to the output of a sense amplifier; POUT is coupled to the corresponding Data I/O of the System-on-Chip; SIN is the serial IN input connected to the SOUT of the previous sense amplifier while SOUT is the serial output connected to the SIN of the next sense amplifier.

This scan-chain 430 formed by the interconnected cells 480, using the serial input and output, has some advantages:
  allow testing the successful interconnection between the SoC structure 10 and the memory component 1;
  allow implementing a digital test of the sense amplifiers,
  allow working as second level of latches.

Moreover, since the cell can work as program load to store the data inside the matrix of memory cells, usually the program load are buffer used to drive the program operation inside the array using it as comparison register.

We will see later in the present disclosure that when the first 128 Bits are ready to be transferred to the parallel output POUT of the sense amplifier, there is an internal latch coupled to the sense amplifier that can trigger the read data of the subsequent section of the remaining 128 Bits.

But let's proceed in good order.

The System-on-Chip (SoC) structure 200 normally includes more than one core (not shown in the drawings) and each core is coupled to a corresponding bus or channel for receiving and transferring data to the memory component 210. Each sub-array 420 has access to a corresponding channel to communicate with a corresponding core of the SoC.

Each subarray scan-chain 430 can be serially connected to form a unique chain with the other sub-array and/or it can be treated as a separate scan-chain register.

Each sense amplifier SA of the sub-array 420 is couple to a JTAG cell 480.

In some embodiment of the present disclosure the output of a sub-array 420 is formed combining the following sequence: data cells plus address cells plus ECC cells. In particular, a sense amplifier SA is configured to provide and output combining data cells, address cells and ECC cells. The total amount of Bits would involve 168 pads per channel in the implementation disclosed herewith, the memory device architecture being thus configured to transmit a super-page through a channel comprising at least 168 pads. In other words, a sub-array of the plurality of independently addressable sub-arrays is thus organized in enlarged pages comprising data, address and ECC bits.

The combined string of data cells+address cells+ECC cells allows to implement the whole safety coverage of the bus according to the standard requirements of the rule ISO26262, because the ECC covers the whole bus communication (data cells+address cells), while the presence of the address cells provides the confidence that the data is coming exactly from the addressed location of the controller, i.e. if ADD==ADD0.

The memory device 210 can store in a non-volatile manner the initial address that must be read at the boot of the system, that is to say: the whole System-on-Chip or SoC structure with the associated memory component 210.

It must also be remarked that a System on Chip of the present disclosure with an associated non-volatile memory portion (but without the volatile RAM or DRAM) works according to an eXecution-in-Place (XiP) method that retrieves the data from the memory.

Generally speaking, eXecution-in-Place means a method of executing programs directly from a non-volatile memory portion rather than copying it into a volatile memory. It is an extension of using shared memory to reduce the total amount of memory required.

The main effect of the XiP method is that the program text consumes no writable memory, saving such a memory for dynamic data, and that all instances of the program are run from a single copy and executing unconditional jumps directly from the non-volatile memory.

The presence of the unconditional jumps justifies the low initial latency time needed the initial latency is the main root cause of loss of performance in this type of configuration since the size of the double word needed between jumps, i.e. from five to eight double words.

However, the non-volatile memory portion 210 must provide a similar interface to the CPU as a volatile memory and the interface must provide sufficiently fast read operations with a random access pattern; moreover, if there is a file system, it needs to expose appropriate mapping functions and the executed program must be linked to be aware of the appropriate address of the memory portion.

The storage requirements are usually met by using a NOR flash memory portion, which can be addressed as individual words for read operations, although it is a bit slower than normal RAM memories in most setups.

Typically, in SoC including a RAM portion, the first stage boot loader is an XiP program that is linked to run at the address at which the flash chip(s) are mapped at power-up and contains a minimal program to set up the system RAM (which depends on the components used on the individual boards and cannot be generalized enough so that the proper sequence could be embedded into the processor hardware) and then loads the second stage bootloader or the OS kernel into the RAM.

During this initialization, writable memory may not be available, so all computations have to be performed within the processor registers. For this reason, first stage boot loaders tend to be written in assembler language and only do the minimum to provide a normal execution environment for the next program. Some processors either embed a small amount of SRAM in the chip itself or allow using the onboard cache memory as RAM, to make this first stage boot loader easier to write using high-level language.

Well, thanks to the memory architecture of the present disclosure it is possible to pass from a parallel mode for retrieving data and addresses from the memory sub arrays to a serial mode for checking the interconnections.

The transition from the parallel to the serial mode is managed by the JTAG interface 300. However, the implementation of these dual mode operations is allowed by the specific structure of a modified JTAG cell 480 disclosed hereinafter.

Figure 5:
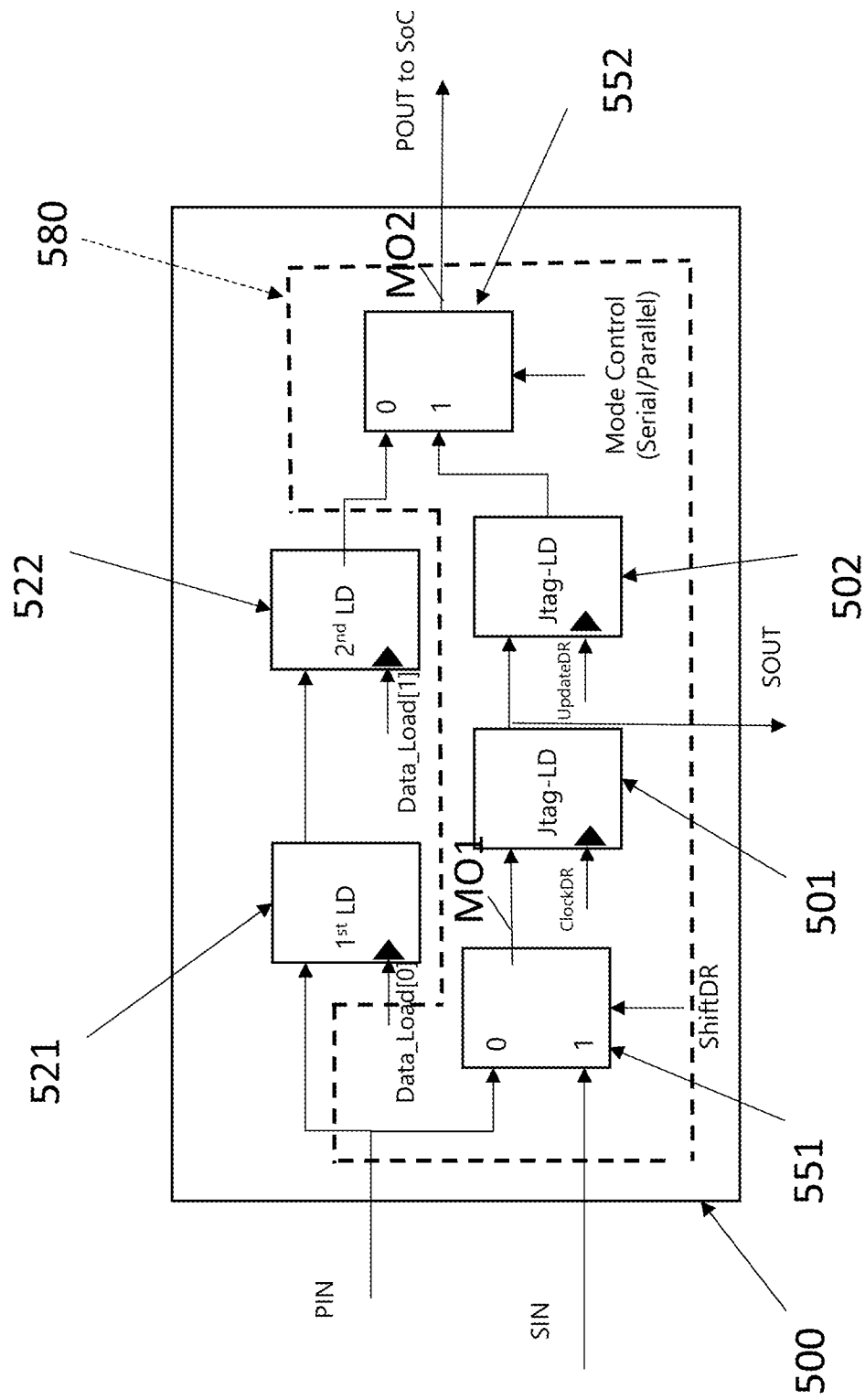
FIG. 5 is a schematic view of JTAG cell that has been modified according to the present disclosure.

Making refence to the schematic example of FIG. 5 it is shown a JTAG cell 500 modified according to the present disclosure. This cell 500 corresponds to the schematic cell 480 of FIG. 4.

The JTAG cell 500 has a first parallel input PIN terminal and a first serial input SIN terminal receiving corresponding signals Pin and Sin. Moreover, the JTAG cell 500 has a first parallel output terminal POUT and a first serial output terminal SOUT. The scan-chain 430 allows outputting the whole 256 bits, because the first group is read directly from the output while the second group is prepared in the back.

As shown in FIG. 5 the JTAG cell 500 may be considered a box with two input terminals PIN and SIN and two output terminals POUT and SOUT. The input terminal PIN is a parallel input while the input terminal SIN is a serial input. Similarly, the output terminal POUT is a parallel output while the output terminal SOUT is a serial output.

Thanks to the serial input and output a testing process may be performed to check that no fault connection is present between the memory component 210 and the associated SoC structure 200. Thanks to the parallel input and output the same JTAG cell is used as data buffer for the completing the reading phase through the sense amplifiers SA.

The JTAG cell 500 comprises a boundary scan basic cell 580 including a couple of latches 501 and 502 and a couple of multiplexer 551 and 552. A first input multiplexer 551 and a second output multiplexer 552.

The boundary scan basic cell 580 is indicated by the dotted line box in FIG. 5 and is a two inputs cell, with a serial input corresponding to SIN and parallel input corresponding to PIN, and two outputs cell with a serial output corresponding to SOUT and a parallel output corresponding to POUT.

The first multiplexer 551 receives on a first input "0" a parallel input signal Pin from the first parallel input terminal PIN and on a second input "1" a serial input signal Sin from the first serial input terminal SIN.

This first multiplexer 551 is driven by a control signal ShiftDR and has an output MO1. The cell 500 has two parallel outputs, i.e. MO1 and MO2. When the JTAG clock arrives, the serial output is driven out from the SOUT. SOUT is connected to the JTAG latch close to the multiplexer that receives a selector signal: Mode Controller (serial/parallel). Basically, the output of the latch connected to the input '1' of this multiplexer MO2 is also the SOUT.

The first multiplexer output MO1 is connected to a first input of the first latch 501 that receives on a second input terminal a clock signal ClockDR.

The first latch 501 is connected in chain to the second latch 502 with a first output of the first latch 501 connected to a first input of the second latch 502.

It is important to note that the output of the first latch 501 is also the serial output SOUT of the whole JTAG cell 500.

A second input terminal of the second latch 502 received a signal UpdateDR.

The second latch 502 has an output connected to an input of the second multiplexer 552, in particular to its second input.

This second multiplexer 552 is controlled by a Mode Control signal that allows to switch the whole JTAG cell 500 from a serial to a parallel mode and viceversa.

In one embodiment of the present disclosure the JTAG cell 500 further includes another couple of latches 521 and 522 provided between the parallel input Pin and the second multiplexer 552. These extra latches 521 and 522 are the latching of the direct read, i.e. first group of data Bits, and the shadow one, i.e. second group of 128 data Bits. In other words, the JTAG cell 500 includes the boundary scan cell 580 and at least the further latches 521 and 522.

We will refer hereinafter to these further latches as a third latch 521 and a fourth latch 522. In other embodiments a longer chain of latches may be used.

More particularly, the third latch 521 and the fourth latch 522 are connected in a small pipeline configuration with the third latch 521 receiving on a first input the parallel input signal Pin from the first parallel input terminal PIN and receiving on a second input a signal Data_Load[0] corresponding to a first data load.

The fourth latch 522 receives on a first input the output of the third latch 521 and receives on a second input a signal Data_Load[1] corresponding to a subsequent data load.

The output of the fourth latch 522 is connected to the first input "0" of the second multiplexer 552 that produces on its output terminal MO2 the output signal for the parallel output terminal POUT.

If compared to a conventional JTAG cell the JTAG cell 500 of the present disclosure may be considered a modified JTAG cell because of the presence of the two extra latches, the third and fourth latches 521 and 522, beside the presence of the boundary scan cell 580.

Now, since this JTAG cell 500 is coupled to the output of each sense amplifier SA of the memory sub-array 420 it may be considered a data buffer including a data page, including in this example at least one-hundred-and-twenty-eight (128) Bits for the reading of a combined memory page at a time from the four sub arrays 420.

However, as previously reported, the communication channel between the memory component and the SoC structure may need up to 256 Bits at a time (i.e. two combined memory words) and the JTAG cell 500 has been modified just to duplicate the internal latches to be able to shift the first or higher portion of the 128 Bits of the data to be read with the second or lower portion of the data to be read. Obviously, in this contest "higher" means the data portion that is loaded before while "lower" means the data portion that is loaded after.

A skilled in this art will understand that the number of internal latches of the modified JTAG cell 500 can be augmented in case of need to improve the number of Bits to be transferred to the SoC structure through the communication channel. For example, the above structure may be expanded accordingly to the size of the page required by the particular implementation of the memory controller.

Just to explain the manner in which data are transferred in the data buffer we have to imagine that when a data is loaded in the one of the two latches 521 or 522, the other latch is in a stand-by state but ready to receive the subsequent data portion.

Therefore, the first section including 128 Bit is transferred to the SoC structure for a first data elaboration while the reading phase is not stopped since the other portion of 128 Bits are prepared to be loaded into the latches at the subsequent clock signal.

In this example, each data buffers contains 128 modified JTAG cells 500 and the common Data_Load[1:0] are signals generated to allow to capture the whole 256 Bits, that is to say: eight double words DWs according to the proposed implementation (four sub arrays for each double word).

The signal generation is internally controlled when the read operation is performed in a specific data buffer and the signals are controlled by the SoC structure to allow performing read phase using a 128 Bits parallelism.

The main benefit of this memory architecture is that each buffer can contain the whole double words DWs thus leaving free the sense amplifier to read in another memory location.

The presence of the modified JTAG cell 500 is particular important as output of the sense amplifiers since allows:
a. Using the boundary scan as method to check the interconnection between the SoC 10 and the Flash Array component 1;
b. Implement the Direct Memory Access connecting directly the sense amplifier with the controller;
c. It allows to leave the sense amplifier to prepare the second 256 bit wide page plus the address plus the ECC and written close to the page.

Another advantage is given by the possibility to adopt a boundary-scan test architecture including modified JTAG cells 500 thus obtaining a new and peculiar boundary-scan test architecture like the one shown in the schematic view of FIG. 5. This is a further advantage since for this test only one output driven is needed and this is obtained using the signal TCK and the data stored in the cells. The scan chain test requires the SoC 10 to test the output of the scan chain.

A skilled in this art will understand that the number of internal latches of the modified JTAG cell can be augmented in case of need to improve the number of Bits to be transferred to the SoC structure through the communication channel. For example, the above structure may be expanded according to size of the memory device.

Just to explain the manner in which data are transferred in the data buffer we have to imagine that when a data is loaded in the one of the two latches 221 or 222, the other latch is in a stand-by state but ready to receive the subsequent data portion.

Therefore, the first section including 128 Bit is transferred to the SoC structure for a first data elaboration while the reading phase is not stopped since the other portion of 128 Bits are prepared to be loaded into the latches at the subsequent clock signal.

Each data buffers contains 128 modified JTAG cells 500 and the common Data_Load[1:0] are signals generated to allow to capture the whole 256 Bits, that is to say: eight double words DWs according to the proposed implementation.

The signal generation is internally controlled when the read operation is performed in a specific data buffer and the signals are controlled by the SoC structure to allow performing read phase using a 128 Bits parallelism.

The main benefit of this memory architecture is that each buffer can contain the whole double words DWs thus leaving free the sense amplifier to read in another memory location.

The IEEE1532 standard enables the In-System Programming using the IEEE1149 as main interface protocol. The need of having a very low initial latency and high throughput is driving the generation of the following scheme for the addressing per sub-array 420. The point is that we are not interested in the program data load time and we can use a serial interface using standard IEEE 1149 and 1532. The low latency is driven by the proper size of the block and the optimization in the data path. The data path is, usually, the internal gates that are connecting the array to the output pads Let's now see the Array Addressing Scheme in JTAG making reference to the examples of FIGS. 7 and 8.

Figure 7:
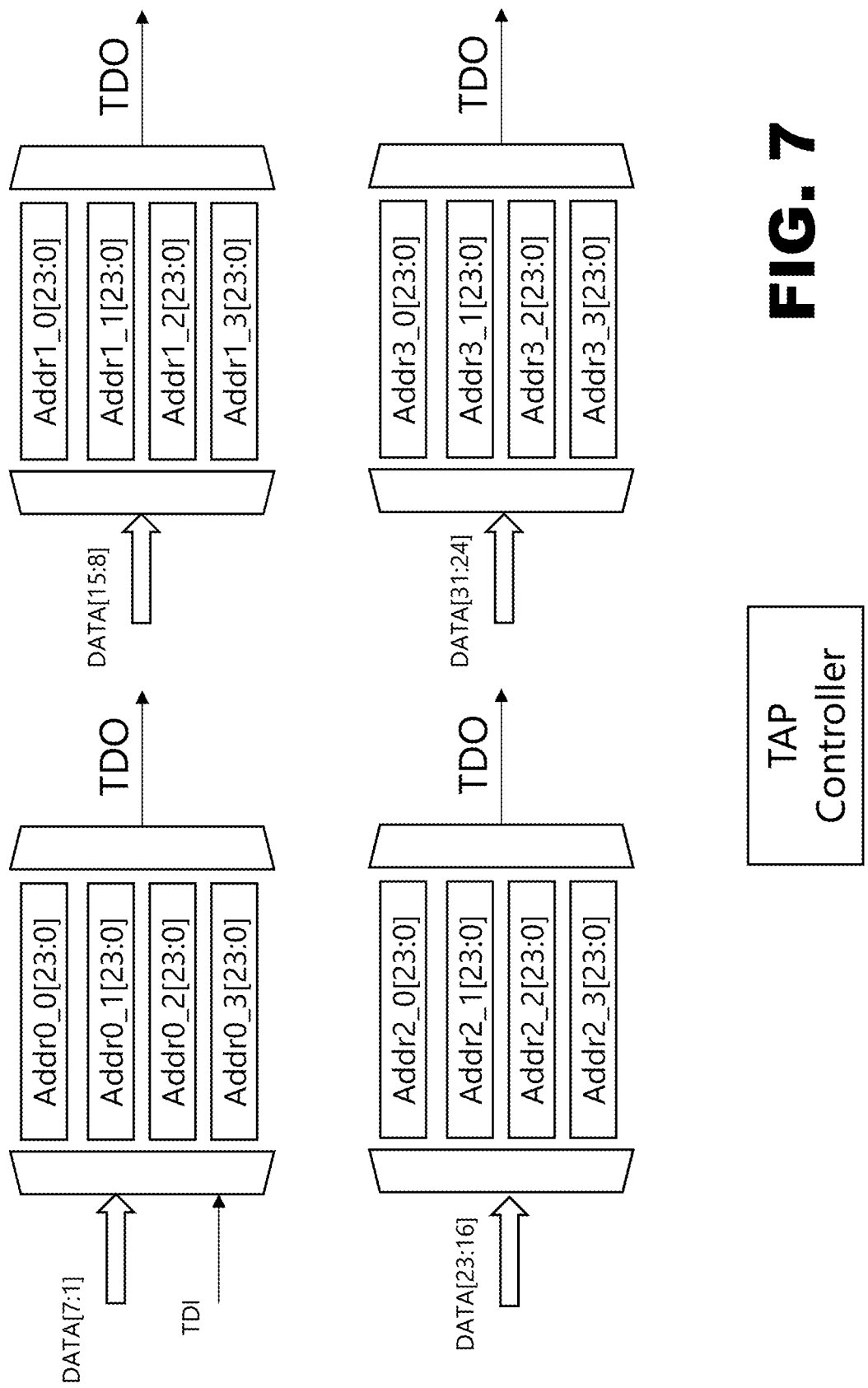
FIGS. 7 and 8 are schematic views of a relationship between address and data registers in the memory portion of the present disclosure.

Making first reference to FIG. 7, it is illustrated a sub-array addressing scheme which involve a set of instructions implemented in two ways which are: global address loading and local address loading.

The need of having a very low initial latency and high throughput is driving the generation of the following scheme for the addressing per sub-array. FIG. 6 shows row address buffers and the corresponding row data buffers in the structure similar to DRAM but here we have adopted the super-pages addresses and corresponding data, i.e. 168×2.

The implemented set of instructions to address the memory array implemented can be of two types or two levels of address; in other words: a global instruction selects the sub array while a local instruction selects one of the address register (for instance one of the four) associated with the selected subarray.

Global address loading: in this case all the sub array will receive the address in multiple steps using a command, i.e. load_global_address_0, load_global_address_1, etc.

Local address loading: in this case only the addressed register in the selected sub-array will receive the new address, i.e. local_address_0_0, local_address_0_1, local_global_address_1_3, etc.

Each sub-array will contain a set of 4× data registers, for instance 4× (data+address+ECC registers) corresponding each to an address register. 4× data registers are containing a super-page, that is to say: data_H+data_L (having removed the link to the specific address).

The address registers are connected to the address decoder when the read or modify operation are addressing the array. The link is driven by the flash controller in the modify phase while the read finite state machine is linking them when the read is triggered. The address register is loaded using a JTAG finite state machine. when the corresponding instruction, Load_Address is recognized and the Shift_DR state is in the JTAG tap then the TDI is connected to the address register.

A Global_Address_Loadx command is used to load at the same time the nibble of eight bits in the corresponding registers:

Global_Address_Load0 in the instruction register generates the load of the addr0_0. This command, for example, can address the sub array 0; similarly, it happens for the selection of the corresponding sub array address registers, addr1_0, addr2_0 and addr3_0 using three TCK cycles when the finite state machine of the JTAG interface is in the Shift_DR state.

Local_Address_Load0_0 in the instruction register generates the load of the addr0_0, using three TCK cycles when the finite state machine is in the Shift_DR state. This command, as example, addresses the register 0 of the selected subarray. This means that when the ShiftDR is reached the TDI is connected to the input of this shift register and the TDO to the output, if the flexible TDI is used we need only three clock periods Tck to have the whole address inside the selected address register, otherwise we would need 24 clock periods Tck.

These instructions (Global_Address_Load0, Global_Address_Load1, Global_Address_Load2, Global_Address_Load3) allow the pre-load of the address for all the channels implemented in the flash array. Those four instructions are implemented to select one of the four sub array. In a possible implementation with eight cores, we will need eight commands, one for each core or a method to select one of the cores using one command and a sub array address. Therefore, the introduction of the above command permits to optimize the communication between the SoC structure 10 and the memory component 1 enhancing the transfer performance to the controller The instructions (Local_Address_Load0_0, Local_Address3_3) allow the use of a single core/channel avoiding the need for the controller to manage the whole set of cores when only one is working; the cores are independent and they can use their own channel when it is needed. These instructions serves for selecting one of the address register of the selected subarray.

The implementation of this last disclosed mechanisms ensures the optimization of the read operation of the memory.

Figure 8:
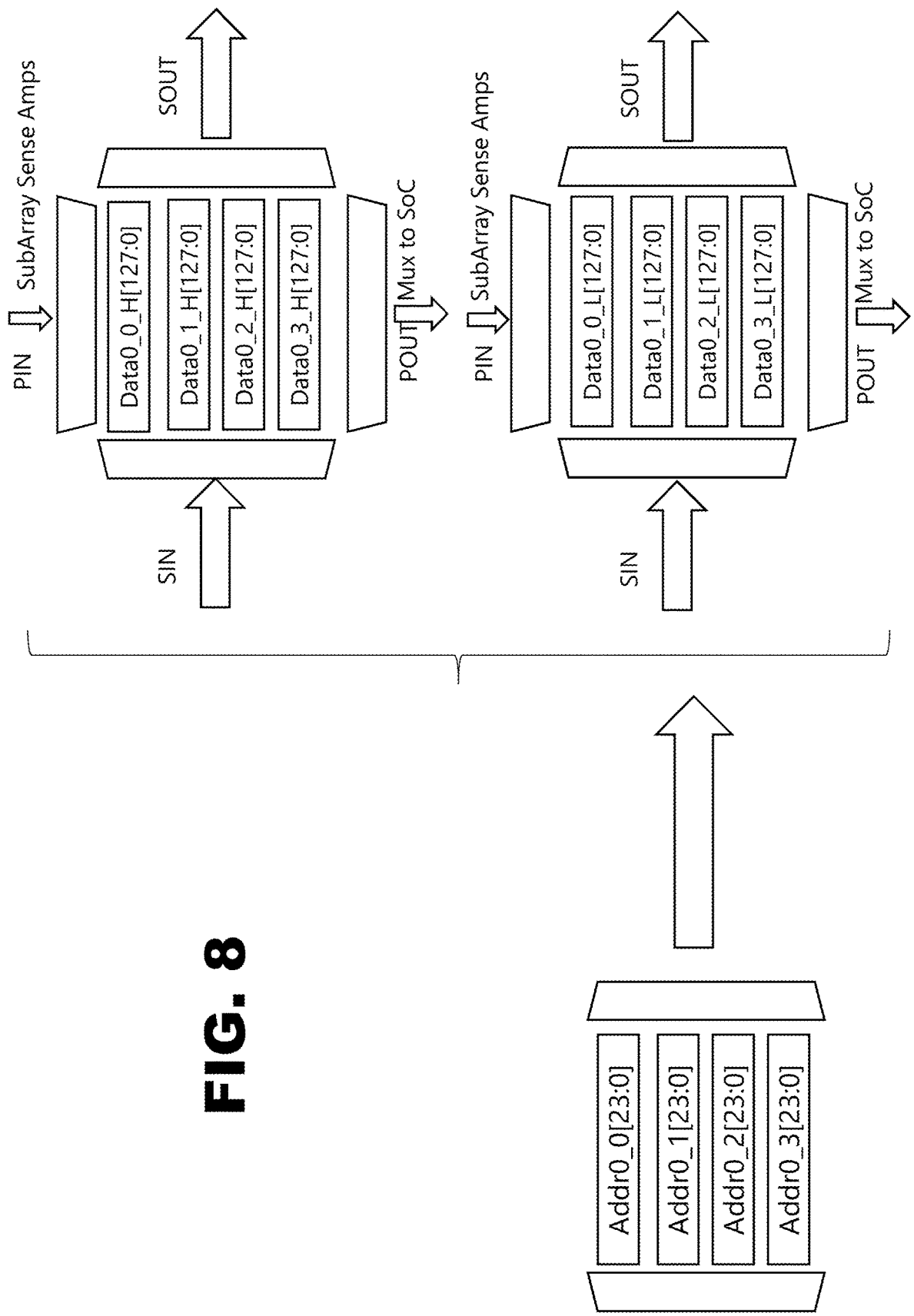

Making now reference to the example of FIG. 8, if the SoC structure 200 needs up to 168×2 Bits at a time, the data buffers will be duplicated so to be able to shift, assuming to use the address 0 of the sub array 0:
First pass of the first group of Bits: Data 0_0_H [127:0]+ADD+ECC
Second pass of the second group of Bits: Data 0_0_L [127:0]+ADD+ECC The address buffers are made using JTAG Cells.

According to the standard IEEE 1149 and 1532 concerning the JTAG, the protocol IEEE1532 is used as expanded command set to operate in each sub array and the new sub-array structure enables the In-System Programming.

From the foregoing, it will be appreciated that specific embodiments of the invention have been described herein for purposes of illustration, but that various modifications may be made without deviating from the scope of the invention. Accordingly, the invention is not limited except as by the appended claims.

The invention claimed is:

1. An apparatus, comprising:
a System on Chip (SoC); and
a non-volatile memory device coupled to the SoC and having a structurally independent structure linked to the SoC, the non-volatile memory device comprising:
   a plurality of sub arrays forming a matrix of memory cells with associated decoding and sensing circuitry;
   sense amplifiers coupled to a corresponding sub array;
   a data buffer comprising a plurality of JTAG cells coupled to outputs of the sense amplifiers, wherein each JTAG cell of the plurality of JTAG cells include:
      a parallel input (PIN) terminal and a serial input (SIN) terminal; and
      a parallel output terminal (POUT) and a serial output terminal (SOUT); and
   a scan-chain connecting together the JTAG cells of the data buffer, wherein the scan-chain includes;
      the PIN terminal of a first JTAG cell coupled to an output of a first sense amplifier;
      the POUT terminal of the first JTAG cell is coupled to a corresponding data input/output terminal of the SoC;
      the SIN terminal of the first JTAG cell is coupled to the SOUT terminal of a second JTAG cell; and
      the SOUT terminal of the first JTAG cell is coupled to the SIN terminal of a third JTAG cell.

2. The apparatus of claim 1, wherein each sub array is independently addressable inside the memory device.

3. The apparatus of claim 1, wherein the scan-chain forms a single shift register for testing the interconnection between pads of the memory portion and corresponding pads of the SoC.

4. The apparatus of claim 1, wherein the JTAG cells are serially connected in the scan-chain.

5. The apparatus of claim 1, wherein the JTAG cells include a boundary scan cell comprising:
an input multiplexer
an output multiplexer; and
a pair of latches between the input multiplexer and the output multiplexer.

6. The apparatus of claim 5, wherein the pair of latches are connected in a pipeline between a parallel input and a parallel output.

7. The apparatus of claim 1, wherein a sub-array of the plurality of sub-arrays comprises super-pages including data, address, and ECC cells.

8. The apparatus of claim 1, further comprising at least four sub arrays to communicate with corresponding cores of the SoC.

9. A non-volatile memory architecture configured to be coupled to a System-on-Chip (SoC) device, comprising:
an array of memory cells formed by plurality of sub arrays;
sense amplifiers coupled to a corresponding sub array of the plurality of sub- arrays;
sense amplifiers coupled to the memory cells having respective outputs;
a data buffer including a plurality of JTAG cells coupled to the outputs of the sense amplifiers, wherein each JTAG cell of the plurality of JTAG cells include;
   a parallel input (PIN) terminal and a serial input (SIN) terminal; and a parallel output terminal (POUT) and a serial output terminal (SOUT); and a scan-chain connecting together the JTAG cells of the data buffer, wherein the scan-chain includes;

the PIN terminal of a first JTAG cell is coupled to an output of a first sense amplifier;

the POUT terminal of the first JTAG cell is coupled to a corresponding data input/output terminal of the SoC;

the SIN terminal of the first JTAG cell is coupled to SOUT terminal of a second JTAG cell; and the SOUT terminal of the first JTAG cell is coupled to the SIN terminal of a third JTAG cell.

10. The non-volatile memory architecture of claim 9, further comprising at least a pair of latches connected in a pipeline between a parallel input and a parallel output.

11. The non-volatile memory architecture of claim 9, further comprising a channel of 168 pads for transmitting a super-page.

12. An integrated circuit, comprising:

a System on Chip (SoC) device; and a non-volatile memory device coupled to the SoC, wherein the SoC and the non-volatile memory device are independent dies and are coupled via pins or pads, or both; and wherein:

a memory array in the memory device including a plurality of independently addressable sub arrays;

sense amplifiers coupled to corresponding outputs of the sub arrays and coupled to a communication channel of the SoC device; and a scan-chain comprising modified JTAG cells, wherein the scan-chain include a parallel input (PIN) terminal of a first JTAG cell coupled to an output of a first sense amplifier, a parallel output terminal (POUT) of the first JTAG cell coupled to a corresponding data input/output terminal of the SoC, a serial input (SIN) terminal of the first JTAG cell coupled to the serial output terminal (SOUT) of a second JTAG cell, and a serial output terminal (SOUT) of the first JTAG cell is coupled to a serial input (SIN) terminal of a third JTAG cell.

13. The integrated circuit of claim 12, wherein, a sense amplifier is configured to provide an output combining data cells, address cells, and ECC cells.

14. The integrated circuit of claim 12, wherein a sub-array of the plurality of independently addressable sub-arrays is organized in enlarged pages comprising data, address, and ECC bits.

15. The integrated circuit of claim 12, wherein the modified JTAG cells are boundary-scan cells including a pair of latches between a parallel input and parallel output.

16. The integrated circuit of claim 12, wherein the modified JTAG cells are serially connected in the scan-chain.

17. The integrated circuit of claim 12, wherein each sub-array of a memory die of the memory device corresponds to a core of associated SoC device.

18. The integrated circuit of claim 12, wherein the memory device is a Flash memory.

19. The integrated circuit of claim 12, wherein the SoC device includes a plurality of cores each one in communication with a corresponding sub-array of the memory device a Direct Memory Access manner.

20. The integrated circuit of claim 12, wherein an independent memory device includes logic circuitry with a Finite State Machine or RISC portion for communicating with the SoC device.

* * * * *